United States Patent [19]
Kaminow

[11] Patent Number: 4,573,163
[45] Date of Patent: Feb. 25, 1986

[54] LONGITUDINAL MODE STABILIZED LASER
[75] Inventor: Ivan P. Kaminow, Holmdel, N.J.
[73] Assignee: AT&T Bell Laboratories, Murray Hill, N.J.
[21] Appl. No.: 417,568
[22] Filed: Sep. 13, 1982
[51] Int. Cl.[4] .............................................. H01S 3/19
[52] U.S. Cl. ...................................... 372/96; 357/17; 372/45
[58] Field of Search ....................... 372/44, 45, 46, 96; 357/17

[56] References Cited

U.S. PATENT DOCUMENTS

| | | | |
|---|---|---|---|
| 3,760,292 | 9/1973 | Kogelnik et al. | 331/94.5 |
| 3,970,958 | 7/1976 | Streifer et al. | 372/96 |
| 4,025,939 | 5/1977 | Aiki et al. | 372/96 |
| 4,257,011 | 3/1981 | Nakamura et al. | 331/94.5 |
| 4,359,776 | 11/1982 | Acket et al. | 372/46 |
| 4,400,813 | 8/1983 | Kaminow | 372/45 |

OTHER PUBLICATIONS

Optical Communications Conference—Amsterdam, Netherlands, 9-17 through 19, 1979—"A Novel Single Mode Laser Having Periodic Variations in the Stripe Width ('Super DFB')" P. J. de Waard (Philips Research Labs., Eindhovan, Netherlands.
Kawaguchi et al., "Bistable Operation in Semiconductor Lasers with Inhomogeneous Excitation", *Electronics Letters* Feb. 19, 1981, vol. 17, No. 4, pp. 167-168.

*Primary Examiner*—James W. Davie
*Attorney, Agent, or Firm*—Sylvan Sherman; Richard D. Laumann

[57] ABSTRACT

Stabilized, single-mode operation of semiconductor lasers is obtained by introducing longitudinally spaced variations in the effective refractive index along the active waveguiding medium, where said index changes have a spatial period corresponding to many half-wavelengths of the guided optic wave. Because the spatial period of the variations is relatively long, as opposed to half an optical wavelength used in the prior art distributed feedback lasers, a laser in accordance with the invention is much easier to fabricate.

6 Claims, 1 Drawing Figure

LONGITUDINAL MODE STABILIZED LASER

TECHNICAL FIELD

This application relates to longitudinal mode stabilized lasers and, in particular, to single longitudinal mode, semiconductor lasers.

BACKGROUND OF THE INVENTION

Single longitudinal mode operation of semiconductor lasers is a desirable property for many applications. Fundamental transverse mode operation has already been obtained using a variety of lateral confinement laser configurations. Single longitudinal mode operation has been obtained with distributed feedback (DFB) structures without the need of a Fabry-Perot cavity resonator. Lasers of this type are described in U.S. Pat. No. 3,675,157.

Because the spatial period of the DFB mechanism is half the optical guide wavelength, the fabrication of DFB lasers is quite difficult. In addition, the threshold currents generally are much higher than for lasers with cavity resonators.

Another form of longitudinal mode control was disclosed by P. J. deWaard in his paper entitled "A Novel Single Mode Laser Having Periodic Variations in the Stripe Width ("Super DFB")," which was presented at the *Optical Communications Conference in Amsterdam, Netherlands*, Sept. 17-19, 1979. In the laser described by deWaard, a combination of cavity resonator and a small amount of distributed feedback is used. To provide the DFB, the electrode contains three periodic variations in the width of the electrode as a means of controlling longitudinal mode behavior. Unlike the typical DFB configuration, however, the period of the width variations is many multiples of half the optical wavelength. This relatively large variation in the dimension of the electrode has the advantage of simlifying the fabrication process.

An improvment over the deWaard laser is described in the copending application by I. P. Kaminow, Ser. No. 285,253, filed July 20, 1981, now U.S. Pat. No. 4,400,813 issued on Aug. 23, 1983. In the Kaminow laser, longitudinal mode stabilization is achieved by notching the ridge portion of a ridge waveguide laser at periodic intervals along its entire length. Electrical contact is made only at the topmost portions of the ridge. By pumping the laser at periodically spaced regions, only those longitudinal modes whose amplitude maxima conicide with the spatial distribution of the pumped regions are supported.

It has been found, however, that one of the reasons the mode control obtained by the above-described techniques is relatively weak is that the mode selective mechanism is located too far from the active region of the laser so that the high spatial frequency components of the periodic perturbation are very weak in the active region. A second reason is that these prior art devices depend on periodic gain variations and require large variations in gain in order to operate successfully. Since the maximum available gain is limited, approximately half the laser length must be weakly excited which, in turn, tends to limit the overall gain of the laser.

In U.S. Pat. No. 4,257,011 distributed feedback is obtained by means of a Bragg diffraction grating which introduces variations in the complex refractive index of the wavepath. However, the desired spatial period of the grating, as disclosed in this patent, is as low an order as is permitted by the fabrication process. For example, in the illustrative embodiment described, for a 0.83 μm laser, the order is three.

SUMMARY OF THE INVENTION

Longitudinal mode stablization in semiconductor lasers is obtained by introducing periodic perturbations in the transmission characteristic of the waveguiding active medium. In accordance with the present invention, these perturbations have a spatial period corresponding to many multiples of half a wavelength of the guided optical wave. In the illustrative embodiment to be described, a coarse Bragg diffraction grating is etched into the laser substrate. Whether or not a Fabry-Perot resonant cavity is needed in addition depends upon the strength of the interaction between the optical wave and the grating.

It is an advantage of the invention that by using a coarse grating, instead of the usual DFB grating of half an optical wavelength, the laser is much easier to fabricate because of reduced dimensional tolerances. Advantageously, the spatial period is equal to at least ten times half the optical wavelength.

BRIEF DESCRIPTION OF THE DRAWING

The FIGURE shows a semiconductor laser in accordance with the present invention.

DETAILED DESCRIPTION

Figure 1:
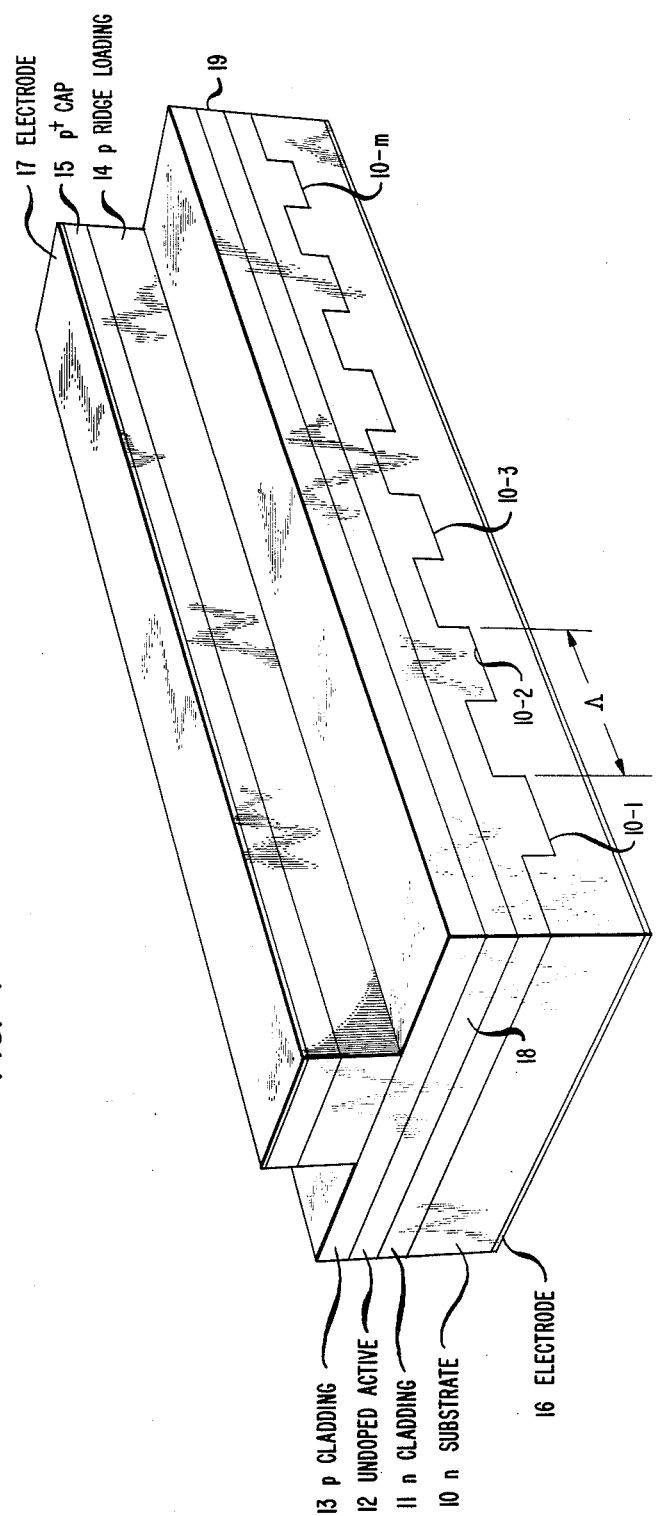

Referring to the drawing, the FIGURE shows an illustrative mode-stabilized, semiconductor laser structure in accordance with the present invention. For purposes of explanation, a ridge-type structure is used to obtain transverse mode confinement. However, as will become apparent, the principles of the invention are readily applicable to other laser structures such as stripe lasers and buried heterostructure lasers.

The basic ridge-type laser comprises, as shown in the FIGURE, a substrate layer 10, a first cladding layer 11, an active layer 12, a second cladding layer 13, a ridge loading layer 14, and a cap 15. Metal electrodes 16 and 17 are located along the exposed substrate and cap surfaces, respectively. The various layers are successively formed by well-known liquid, vaor-phase or other epitaxial technology. In an illustrative embodiment, the substrate is n-type InP; the first cladding is n-type InGaAsP, having a band gap of 1.3 μm; the active layer is undoped InGaAsP, having a band gap of 1.5 μm; the second cladding is p-type InGaAsP, having a band gap of 1.3 μm; the ridge loading layer is p−-type InP; and the cap layer is p+-type InGaAsP. A Fabry-Perot resonant cavity can be formed by cleaving the end surface 18 and 19 to form reflecting mirrors or the Fabry-Perot cavity can be eliminated by destroying the mirror reflectivity using known methods.

To introduce the desired longitudinal mode stabilization, a periodic discontinuity is included along the direction of wave propagation. In the illustrative embodiment this discontinuity comprises a Bragg diffraction grating formed by ion milling or chemical etching a series of transverse grooves 10-1, 10-2, . . . 10-n along the upper surface of substrate 10. Thus, the illustrated interface between substrate 10 and the first cladding 11 is a square wave having a spatial period, $\Lambda$, given by $$\Lambda = m\lambda/2N \quad (1)$$

where m is an integer; λ is the free-space wavelength of an optical wave; and N is the effective refractive index of the waveguide formed by the laser structure. In general, however, the grating may have other periodic profiles.

As can be seen from equation (1), for any given value of Λ there are many combinations of m and λ that satisfy the equation. However, in order to obtain the desired mode stabilization, one of these wavelengths must fall within the gain-bandwidth curve of the laser material. Assuming a gain-bandwidth, B, the probability of this occurring will be high if the spacing, Δλ, between optical wavelengths that satisfy equation (1) is equal to or slightly greater than B. If Δλ is less than B, it is certain that at least one optical wavelength will satisfy the equation. However, if more than one optical wavelength falls within the gain-bandwidth, multimode operation can occur. In order to determine the manner in which Δλ changes as a function of m for different values of Λ, the partial derivative of the wavelength is taken with respect to the integer m, which is typically a large number, thereby obtaining the relationship $$\Delta\lambda/\Delta m = \lambda^2/2N\Lambda. \quad (2)$$

EXAMPLE

Assuming laser operation in the region of λ=1.53μ and, estimating N=3.5 for the particular materials used in the illustrative embodiments m can be calculated from equation (1) for various values of Λ. However, m must be an integer and, in particular, for the square-wave perturbation used, m must be an odd integer. Accordingly, after making the calculations for m, the closest odd integer is selected and λ is recalculated for each assumed value of Λ. The results of these calculations are given in TABLE I. Also shown in the change in wavelength, Δλ, for Δm=1 and Δm=2, as calculated from equation (2). For a general grating profile, non-vanishing spatial harmonics may be present for all m, i.e., Δm=1.

TABLE I

| Λ | m | λ | Δλ (Δm = 1) | Δλ (Δm = 2) |
|---|---|---|---|---|
| 40μ | 183 | 1.530μ | 83Å | 163Å |
| 33 | 151 | 1.530 | 101 | 202 |
| 22 | 101 | 1.524 | 149 | 298 |
| 16 | 73 | 1.534 | 207 | 414 |
| 12 | 55 | 1.527 | 273 | 546 |
| 9 | 41 | 1.536 | 366 | 732 |
| 6 | 27 | 1.555 | 555 | 1110 |
| 5 | 23 | 1.522 | 819 | 1638 |

As indicated hereinabove, as a first approximation for a preferred embodiment, one would like to have Δλ approximately equal to the gain-bandwidth of the laser medium. For the particular material used in the illustrative embodiment, strong gain can be obtained over a bandwidth of about 150 Å. Referring to the table, this would suggest a Λ of 40μ, for which Δλ is 163 Å. A possible drawback with this design is that it utilizes a relatively high order (i.e., the 183rd) spatial harmonic, which might be too weak. A lower order spatial harmonic (i.e., the 73rd) can be utilized when Λ equals 16. However, for this configuration Δλ is equal to 414 Å. This is quite a bit larger than the gain-bandwidth of 150 Å, in which case some sort of tuning, such as thermal tuning, may be required to insure that the desired spatial harmonic falls near the peak of the gain-bandwidth of the laser medium.

While the square wave grating has only odd spatial harmonics, Table I also includes calculations for Δλ for all m (Δm=1) as well. These were included for the general grating case as well as to recognize that higher-order Bragg diffraction effects can give rise to laser activity even though there are no even spatial harmonics of the grating present. In regard to weak Bragg resonance, it is important to note that a Fabry-Perot resonant cavity can be employed simultaneously with the coarse grating distributed feedback. The Fabry-Perot resonance will serve to reinforce the mode resonance of the distributed feedback and reduce the threshold current.

If the cavity length is L, the Fabry-Perot cavity modes are given by $$L = p\lambda/2N. \quad (3)$$

The cavity modes and the grating resonances coincide only if $$L/\Lambda = p/m \quad (4)$$

and if the phase of the grating is properly adjusted with respect to the Fabry-Perot mirrors.

However, the width, δλ, of the grating resonance due to the finite grating length L is given by $$\delta\lambda = \lambda^2/2NL \quad (5)$$

which is just equal to the spacing between Fabry-Perot cavity modes.

Thus, there will always be a reasonable overlap of the cavity and grating resonances.

In summary, stabilized, single longitudinal mode semiconductor laser operation can be obtained by means of a coarse perturbation in the transmission characteristic of the passive wave guiding active medium. The resulting mode feedback can be further enhanced by placing the laser within a Fabry-Perot resonant cavity.

What is claimed is:

1. A semiconductor laser comprising:
   an active medium;
   a first cladding layer of p-type semiconductor material;
   a second cladding layer of n-type medium semiconductor material, said active medium being between said first and second layers;
   first and second electrical contacts to said first and second layers, respectively;
   and a feedback mechanism including periodic perturbations in the transmission characteristic of said laser;
   characterized in that:
   the spatial period, Λ, of said perturbations is equal to at least ten times half the wavelength of the optical wave guided by said laser, said perturbations comprising refractive index changes of said laser.
2. The laser according to claim 1 wherein $$\Lambda = m\lambda/2N,$$

where:
   λ is the free-space wavelength of the guided wave;

N is the effective refractive index of the waveguide formed by said laser; and m is an integer equal to or greater than 10.

3. The laser according to claim 1 wherein said feedback mechanism is a Bragg diffraction grating.

4. The laser according to claim 1 wherein the feedback mechanism extends along the entire length, L, of said laser.

5. The laser according to claim 1 wherein the ends of said laser form a Fabry-Perot cavity resonator.

6. The laser according to claim 1 comprising an active layer of semiconductor material disposed between said first cladding layer and said second cladding layer; wherein at least one of said layers includes periodic discontinuities longitudinally distributed along the direction of wave propagation.

* * * * *